US007208914B2

(12) United States Patent  
Klang

(10) Patent No.: US 7,208,914 B2  
(45) Date of Patent: Apr. 24, 2007

(54) APPARATUS AND METHOD FOR PREDICTING THE REMAINING DISCHARGE TIME OF A BATTERY

(75) Inventor: James K. Klang, Downers Grove, IL (US)

(73) Assignee: Midtronics, Inc., Willowbrook, IL (US)

( * ) Notice: Subject to any disclaimer, the term of this patent is extended or adjusted under 35 U.S.C. 154(b) by 1 day.

(21) Appl. No.: 10/748,792

(22) Filed: Dec. 30, 2003

(65) Prior Publication Data

US 2004/0157113 A1    Aug. 12, 2004

Related U.S. Application Data

(60) Provisional application No. 60/437,611, filed on Jan. 2, 2003, provisional application No. 60/437,255, filed on Dec. 31, 2002.

(51) Int. Cl.
*H01M 10/44* (2006.01)
*H01M 10/46* (2006.01)

(52) U.S. Cl. ...................................................... 320/132

(58) Field of Classification Search ................ 320/132, 320/134, 139; 324/426, 430
See application file for complete search history.

(56) References Cited

U.S. PATENT DOCUMENTS

| | | | |
|---|---|---|---|
| 2,514,745 A | 7/1950 | Dalzell .................... 171/95 |
| 3,356,936 A | 12/1967 | Smith ...................... 324/29.5 |
| 3,562,634 A | 2/1971 | Latner ......................... 31/4 |
| 3,593,099 A | 7/1971 | Scholl ...................... 320/13 |
| 3,607,673 A | 9/1971 | Seyl ............................ 204/1 |
| 3,676,770 A | 7/1972 | Sharaf et al. .............. 324/29.5 |
| 3,729,989 A | 5/1973 | Little ......................... 73/133 |
| 3,750,011 A | 7/1973 | Kreps ...................... 324/29.5 |
| 3,753,094 A | 8/1973 | Furuishi et al. ........... 324/29.5 |
| 3,808,522 A | 4/1974 | Sharaf ...................... 324/29.5 |
| 3,811,089 A | 5/1974 | Strezelewicz .............. 324/170 |
| 3,873,911 A | 3/1975 | Champlin ................. 324/29.5 |
| 3,876,931 A | 4/1975 | Godshalk .................. 324/29.5 |
| 3,886,443 A | 5/1975 | Miyakawa et al. ........ 324/29.5 |
| 3,906,329 A | 9/1975 | Bader ........................ 320/44 |
| 3,909,708 A | 9/1975 | Champlin ................. 324/29.5 |
| 3,936,744 A | 2/1976 | Perlmutter ................. 324/158 |
| 3,946,299 A | 3/1976 | Christianson et al. ...... 320/43 |
| 3,947,757 A | 3/1976 | Grube et al. .............. 324/28 |
| 3,969,667 A | 7/1976 | McWilliams .............. 324/29.5 |
| 3,979,664 A | 9/1976 | Harris ........................ 324/17 |
| 3,984,762 A | 10/1976 | Dowgiallo, Jr. ........... 324/29.5 |
| 3,984,768 A | 10/1976 | Staples ...................... 324/62 |
| 3,989,544 A | 11/1976 | Santo ....................... 429/65 |
| 4,008,619 A | 2/1977 | Alcaide et al. ............ 73/398 |
| 4,024,953 A | 5/1977 | Nailor, III ................. 206/344 |
| 4,047,091 A | 9/1977 | Hutchines et al. ........ 363/59 |
| 4,053,824 A | 10/1977 | Dupuis et al. ............ 324/29.5 |
| 4,070,624 A | 1/1978 | Taylor ....................... 327/158 |
| 4,086,531 A | 4/1978 | Bernier ..................... 324/158 |
| 4,112,351 A | 9/1978 | Back et al. ................ 324/16 |
| 4,114,083 A | 9/1978 | Benham et al. ........... 320/39 |
| 4,126,874 A | 11/1978 | Suzuki et al. ............. 354/60 |
| 4,178,546 A | 12/1979 | Hulls et al. ............... 324/158 |
| 4,193,025 A | 3/1980 | Frailing et al. ........... 324/427 |
| 4,207,611 A | 6/1980 | Gordon .................... 364/580 |
| 4,217,645 A | 8/1980 | Barry et al. .............. 364/483 |
| 4,297,639 A | 10/1981 | Branham .................. 324/429 |
| 4,315,204 A | 2/1982 | Sievers et al. ............ 322/28 |
| 4,316,185 A | 2/1982 | Watrous et al. ........... 340/636 |
| 4,322,685 A | 3/1982 | Frailing et al. ........... 324/429 |
| 4,351,405 A | 9/1982 | Fields et al. .............. 180/65 |
| 4,361,809 A | 11/1982 | Bil et al. .................. 324/426 |
| 4,363,407 A | 12/1982 | Barkler et al. ............ 209/3.3 |
| 4,369,407 A | 1/1983 | Korbell ..................... 324/416 |
| 4,379,989 A | 4/1983 | Kurz et al. ................ 320/26 |
| 4,379,990 A | 4/1983 | Sievers et al. ............ 322/99 |
| 4,385,269 A | 5/1983 | Aspinwall et al. ....... 320/14 |
| 4,390,828 A | 6/1983 | Converse et al. ........ 320/32 |
| 4,392,101 A | 7/1983 | Saar et al. ................ 320/20 |
| 4,396,880 A | 8/1983 | Windebank ............... 320/21 |
| 4,408,157 A | 10/1983 | Beaubien .................. 324/62 |
| 4,412,169 A | 10/1983 | Dell'Orto ................. 320/64 |
| 4,423,378 A | 12/1983 | Marino et al. ........... 324/427 |

(Continued)

FOREIGN PATENT DOCUMENTS

DE       29 26 716 B1       1/1981

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner*—Edward H. Tso
(74) *Attorney, Agent, or Firm*—Westman, Champlin & Kelly

(57) ABSTRACT

A method and apparatus for predicting the remaining discharge time of a battery are provided. The method includes measuring a dynamic parameter of the battery, obtaining a discharge current of the battery, measuring a voltage of the battery and obtaining a temperature of the battery. The remaining run time of the battery is predicted as a function of the measured battery dynamic parameter, the discharge current, the measured battery voltage, the battery temperature, a full charge battery dynamic parameter and an estimated capacity of the battery.

15 Claims, 12 Drawing Sheets

U.S. PATENT DOCUMENTS

| | | | |
|---|---|---|---|
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/158 |
| 4,514,694 A | 4/1985 | Finger | 324/429 |
| 4,520,353 A | 5/1985 | McAuliffe | 340/636 |
| 4,564,798 A | 1/1986 | Young | 320/6 |
| 4,633,418 A | 12/1986 | Bishop | 364/554 |
| 4,659,977 A | 4/1987 | Kissel et al. | 320/64 |
| 4,663,580 A | 5/1987 | Wortman | 320/35 |
| 4,665,370 A | 5/1987 | Holland | 324/429 |
| 4,667,143 A | 5/1987 | Cooper et al. | 320/22 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/32 |
| 4,686,442 A | 8/1987 | Radomski | 320/17 |
| 4,697,134 A | 9/1987 | Burkum et al. | 320/48 |
| 4,707,795 A | 11/1987 | Alber et al. | 364/550 |
| 4,709,202 A | 11/1987 | Koenck et al. | 320/43 |
| 4,710,861 A | 12/1987 | Kanner | 363/46 |
| 4,719,428 A | 1/1988 | Liebermann | 324/436 |
| 4,743,855 A | 5/1988 | Randin et al. | 324/430 |
| 4,745,349 A | 5/1988 | Palanisamy et al. | 320/22 |
| 4,816,768 A | 3/1989 | Champlin | 324/428 |
| 4,820,966 A | 4/1989 | Fridman | 320/32 |
| 4,825,170 A | 4/1989 | Champlin | 324/436 |
| 4,847,547 A | 7/1989 | Eng, Jr. et al. | 320/35 |
| 4,849,700 A | 7/1989 | Morioka et al. | 324/427 |
| 4,876,495 A | 10/1989 | Palanisamy et al. | 320/18 |
| 4,881,038 A | 11/1989 | Champlin | 324/426 |
| 4,888,716 A | 12/1989 | Ueno | 364/550 |
| 4,912,416 A | 3/1990 | Champlin | 324/430 |
| 4,913,116 A | 4/1990 | Katogi et al. | 123/425 |
| 4,929,931 A | 5/1990 | McCuen | 340/636 |
| 4,931,738 A | 6/1990 | MacIntyre et al. | 324/435 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/14 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,032,825 A | 7/1991 | Xuznicki | 340/636 |
| 5,037,778 A | 8/1991 | Stark et al. | 437/216 |
| 5,047,722 A | 9/1991 | Wurst et al. | 324/430 |
| 5,087,881 A | 2/1992 | Peacock | 324/378 |
| 5,095,223 A | 3/1992 | Thomas | 307/110 |
| 5,126,675 A | 6/1992 | Yang | 324/435 |
| 5,140,269 A | 8/1992 | Champlin | 324/433 |
| 5,144,218 A | 9/1992 | Bosscha | 320/44 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/21 |
| 5,194,799 A | 3/1993 | Tomantschger | 320/2 |
| 5,204,611 A | 4/1993 | Nor et al. | 320/21 |
| 5,214,370 A | 5/1993 | Harm et al. | 320/35 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/14 |
| 5,281,919 A | 1/1994 | Palanisamy | 324/427 |
| 5,281,920 A | 1/1994 | Wurst | 324/430 |
| 5,295,078 A | 3/1994 | Stich et al. | 364/483 |
| 5,298,797 A | 3/1994 | Redl | 307/246 |
| 5,300,874 A | 4/1994 | Shimamoto et al. | 320/15 |
| 5,302,902 A | 4/1994 | Groehl | 324/434 |
| 5,313,152 A | 5/1994 | Wozniak et al. | 320/118 |
| 5,315,287 A | 5/1994 | Sol | 340/455 |
| 5,321,626 A | 6/1994 | Palladino | 364/483 |
| 5,321,627 A | 6/1994 | Reher | 364/483 |
| 5,325,041 A | 6/1994 | Briggs | 320/44 |
| 5,331,268 A | 7/1994 | Patino et al. | 320/20 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/35 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/35 |
| 5,365,160 A | 11/1994 | Leppo et al. | 320/22 |
| 5,365,453 A | 11/1994 | Startup et al. | 364/481 |
| 5,381,096 A | 1/1995 | Hirzel | 324/427 |
| 5,410,754 A | 4/1995 | Klotzbach et al. | 370/85.13 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,426 A | 7/1995 | Yoshida | 320/20 |
| 5,434,495 A | 7/1995 | Toko | 320/44 |
| 5,435,185 A | 7/1995 | Eagan | 73/587 |
| 5,442,274 A | 8/1995 | Tamai | 320/23 |
| 5,445,026 A | 8/1995 | Eagan | 73/591 |
| 5,449,996 A | 9/1995 | Matsumoto et al. | 320/20 |
| 5,449,997 A | 9/1995 | Gilmore et al. | 320/39 |
| 5,451,881 A | 9/1995 | Finger | 324/433 |
| 5,457,377 A | 10/1995 | Jonsson | 320/5 |
| 5,469,043 A | 11/1995 | Cherng et al. | 320/31 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636 |
| 5,528,148 A | 6/1996 | Rogers | 324/426 |
| 5,537,967 A | 7/1996 | Tashiro et al. | 123/792.1 |
| 5,541,489 A | 7/1996 | Dunstan | 320/2 |
| 5,546,317 A | 8/1996 | Andrieu | 364/481 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/48 |
| 5,572,136 A | 11/1996 | Champlin | 324/426 |
| 5,574,355 A | 11/1996 | McShane et al. | 320/39 |
| 5,583,416 A | 12/1996 | Klang | 320/22 |
| 5,585,728 A | 12/1996 | Champlin | 324/427 |
| 5,589,757 A | 12/1996 | Klang | 320/22 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/30 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/48 |
| 5,621,298 A | 4/1997 | Harvey | 320/5 |
| 5,633,985 A | 5/1997 | Severson et al. | 395/2.76 |
| 5,637,978 A | 6/1997 | Kellett et al. | 320/2 |
| 5,642,031 A | 6/1997 | Brotto | 320/21 |
| 5,650,937 A | 7/1997 | Bounaga | 364/483 |
| 5,652,501 A | 7/1997 | McClure et al. | 320/17 |
| 5,653,659 A | 8/1997 | Kunibe et al. | 477/111 |
| 5,654,623 A | 8/1997 | Shiga et al. | 320/48 |
| 5,656,920 A | 8/1997 | Cherng et al. | 320/31 |
| 5,675,234 A | 10/1997 | Greene | 320/15 |
| 5,677,077 A | 10/1997 | Faulk | 429/90 |
| 5,699,050 A | 12/1997 | Kanazawa | 340/636 |
| 5,701,089 A | 12/1997 | Perkins | 327/772 |
| 5,705,929 A | 1/1998 | Caravello et al. | 324/430 |
| 5,710,503 A | 1/1998 | Sideris et al. | 320/6 |
| 5,711,648 A | 1/1998 | Hammerslag | 414/786 |
| 5,717,336 A | 2/1998 | Basell et al. | 324/430 |
| 5,717,937 A | 2/1998 | Fritz | 395/750.01 |
| 5,739,667 A | 4/1998 | Matsuda et al. | 320/5 |
| 5,747,909 A | 5/1998 | Syverson et al. | 310/156 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,773,978 A | 6/1998 | Becker | 324/430 |

| | | | |
|---|---|---|---|
| 5,789,899 A | 8/1998 | van Phuoc et al. ............ 320/30 |
| 5,793,359 A | 8/1998 | Ushikubo ................... 345/169 |
| 5,796,239 A | 8/1998 | van Phuoc et al. ......... 320/107 |
| 5,808,469 A | 9/1998 | Kopera ...................... 324/43.4 |
| 5,818,234 A | 10/1998 | McKinnon ................. 324/433 |
| 5,821,756 A | 10/1998 | McShane et al. ........... 324/430 |
| 5,821,757 A | 10/1998 | Alvarez et al. ............. 324/434 |
| 5,825,174 A | 10/1998 | Parker ........................ 324/106 |
| 5,831,435 A | 11/1998 | Troy ........................... 324/426 |
| 5,862,515 A | 1/1999 | Kobayashi et al. .......... 702/63 |
| 5,872,443 A | 2/1999 | Williamson ................... 320/21 |
| 5,872,453 A | 2/1999 | Shimoyama et al. ....... 324/431 |
| 5,895,440 A | 4/1999 | Proctor et al. ................ 702/63 |
| 5,905,914 A * | 5/1999 | Sakai et al. ................... 710/67 |
| 5,914,605 A | 6/1999 | Bertness ..................... 324/430 |
| 5,927,938 A | 7/1999 | Hammerslag ............. 414/809 |
| 5,929,609 A | 7/1999 | Joy et al. ...................... 322/25 |
| 5,939,855 A | 8/1999 | Proctor et al. .............. 320/104 |
| 5,939,861 A | 8/1999 | Joko et al. |
| 5,945,829 A | 8/1999 | Bertness ..................... 324/430 |
| 5,951,229 A | 9/1999 | Hammerslag ............... 414/398 |
| 5,961,561 A | 10/1999 | Wakefield, II ............... 701/29 |
| 5,961,604 A | 10/1999 | Anderson et al. ........... 709/225 |
| 5,969,625 A | 10/1999 | Russo ......................... 340/636 |
| 6,002,238 A | 12/1999 | Champlin ................... 320/134 |
| 6,008,652 A | 12/1999 | Theofanopoulos et al. . 324/434 |
| 6,009,369 A | 12/1999 | Boisvert et al. .............. 701/99 |
| 6,031,354 A | 2/2000 | Wiley et al. ................. 320/116 |
| 6,037,751 A | 3/2000 | Klang ......................... 320/160 |
| 6,037,777 A | 3/2000 | Champlin ................... 324/430 |
| 6,051,976 A | 4/2000 | Bertness ..................... 324/426 |
| 6,055,468 A | 4/2000 | Kaman et al. ................ 701/29 |
| 6,061,638 A | 5/2000 | Joyce ........................... 702/63 |
| 6,072,299 A | 6/2000 | Kurie et al. ................. 320/112 |
| 6,072,300 A | 6/2000 | Tsuji ........................... 320/116 |
| 6,081,098 A | 6/2000 | Bertness et al. ............. 320/134 |
| 6,091,245 A | 7/2000 | Bertness ..................... 324/426 |
| 6,094,033 A | 7/2000 | Ding et al. .................. 320/132 |
| 6,104,167 A | 8/2000 | Bertness et al. ............. 320/132 |
| 6,114,834 A | 9/2000 | Parise ......................... 320/109 |
| 6,137,269 A | 10/2000 | Champlin ................... 320/150 |
| 6,140,797 A | 10/2000 | Dunn .......................... 320/105 |
| 6,144,185 A | 11/2000 | Dougherty et al. ......... 320/132 |
| 6,150,793 A | 11/2000 | Lesesky et al. ............. 320/104 |
| 6,161,640 A | 12/2000 | Yamaguchi ................ 180/65.8 |
| 6,163,156 A | 12/2000 | Bertness ..................... 324/426 |
| 6,167,349 A | 12/2000 | Alvarez ........................ 702/63 |
| 6,172,483 B1 | 1/2001 | Champlin ................... 320/134 |
| 6,172,505 B1 | 1/2001 | Bertness ..................... 324/430 |
| 6,181,545 B1 | 1/2001 | Amatucci et al. ........... 361/502 |
| 6,222,369 B1 | 4/2001 | Champlin ................... 324/430 |
| 6,225,808 B1 | 5/2001 | Varghese et al. ............ 324/426 |
| 6,236,332 B1 | 5/2001 | Conkright et al. ..... 340/825.06 |
| 6,249,124 B1 | 6/2001 | Bertness ..................... 324/426 |
| 6,250,973 B1 | 6/2001 | Lowery et al. .............. 439/763 |
| 6,254,438 B1 | 7/2001 | Gaunt ......................... 439/755 |
| 6,259,254 B1 | 7/2001 | Klang ......................... 324/427 |
| 6,262,563 B1 | 7/2001 | Champlin ................... 320/134 |
| 6,263,268 B1 | 7/2001 | Nathanson .................... 701/29 |
| 6,275,008 B1 | 8/2001 | Arai et al. ................... 320/132 |
| 6,294,896 B1 | 9/2001 | Champlin ................... 320/134 |
| 6,294,897 B1 | 9/2001 | Champlin ................... 320/153 |
| 6,304,087 B1 | 10/2001 | Bertness ..................... 324/426 |
| 6,307,349 B1 | 10/2001 | Koenck et al. ............. 320/112 |
| 6,310,481 B2 | 10/2001 | Bertness ..................... 324/430 |
| 6,313,607 B1 | 11/2001 | Champlin ................... 320/132 |
| 6,313,608 B1 | 11/2001 | Varghese et al. .............. 32/132 |
| 6,316,914 B1 | 11/2001 | Bertness ..................... 320/134 |
| 6,323,650 B1 | 11/2001 | Bertness et al. ............. 324/426 |
| 6,329,793 B1 | 12/2001 | Bertness et al. ............. 320/132 |
| 6,331,762 B1 * | 12/2001 | Bertness ..................... 320/134 |
| 6,332,113 B1 | 12/2001 | Bertness ...................... 702/63 |
| 6,346,795 B2 | 2/2002 | Haraguchi et al. .......... 320/136 |
| 6,347,958 B1 | 2/2002 | Tsai ........................... 439/488 |
| 6,351,102 B1 | 2/2002 | Troy ........................... 320/139 |
| 6,359,441 B1 | 3/2002 | Bertness ..................... 324/426 |
| 6,359,442 B1 | 3/2002 | Henningson et al. ....... 324/426 |
| 6,363,303 B1 | 3/2002 | Bertness ....................... 701/29 |
| 6,384,608 B1 | 5/2002 | Namaky ..................... 324/425 |
| 6,388,448 B1 | 5/2002 | Cervas ....................... 324/426 |
| 6,392,414 B2 | 5/2002 | Bertness ..................... 324/429 |
| 6,411,098 B1 | 6/2002 | Laletin ....................... 324/436 |
| 6,417,669 B1 | 7/2002 | Champlin ................... 324/426 |
| 6,424,157 B1 | 7/2002 | Gollomp et al. ............ 324/430 |
| 6,424,158 B2 | 7/2002 | Klang ......................... 324/433 |
| 6,441,585 B1 | 8/2002 | Bertness ..................... 320/132 |
| 6,445,158 B1 | 9/2002 | Bertness et al. ............. 320/104 |
| 6,456,045 B1 | 9/2002 | Troy et al. .................. 320/139 |
| 6,466,025 B1 | 10/2002 | Klang ......................... 324/429 |
| 6,466,026 B1 | 10/2002 | Champlin ................... 324/430 |
| 6,495,990 B2 | 12/2002 | Champlin ................... 320/132 |
| 6,526,361 B1 | 2/2003 | Jones et al. ................... 702/63 |
| 6,534,993 B2 | 3/2003 | Bertness ..................... 324/433 |
| 6,544,078 B2 | 4/2003 | Palmisano et al. .......... 439/762 |
| 6,556,019 B2 | 4/2003 | Bertness ..................... 324/426 |
| 6,566,883 B1 | 5/2003 | Vonderhaar et al. ........ 324/426 |
| 6,586,941 B2 | 7/2003 | Bertness et al. ............. 324/426 |
| 6,597,150 B1 | 7/2003 | Bertness et al. ............. 320/104 |
| 6,667,624 B1 | 12/2003 | Raichle et al. ............. 324/522 |
| 2002/0010558 A1 | 1/2002 | Bertness et al. ............... 702/63 |
| 2002/0171428 A1 | 11/2002 | Bertness ..................... 324/426 |
| 2003/0025481 A1 | 2/2003 | Bertness ..................... 320/155 |
| 2003/0184306 A1 | 10/2003 | Bertness et al. ............. 324/426 |
| 2004/0000891 A1 | 1/2004 | Raichle et al. ............. 320/107 |

FOREIGN PATENT DOCUMENTS

| | | |
|---|---|---|
| EP | 0 022 450 A1 | 1/1981 |
| EP | 0 637 754 A1 | 2/1995 |
| EP | 0 772 056 A1 | 5/1997 |
| FR | 2 749 397 | 12/1997 |
| GB | 2 088 159 A | 6/1982 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04131779 | 5/1992 |
| JP | 04372536 | 12/1992 |
| JP | 5216550 | 8/1993 |
| JP | 7-128414 | 5/1995 |
| JP | 09061505 | 3/1997 |
| JP | 10056744 | 2/1998 |
| JP | 11103503 A | 4/1999 |
| RU | 2089015 C1 | 8/1997 |
| WO | WO 93/22666 | 11/1993 |
| WO | WO 94/05069 | 3/1994 |
| WO | WO 98/04910 | 2/1998 |
| WO | WO 98/58270 | 12/1998 |
| WO | WO 99/23738 | 5/1999 |
| WO | WO 00/62049 | 10/2000 |
| WO | WO 00/67359 | 11/2000 |
| WO | WO 01/59443 | 2/2001 |
| WO | WO 01/51947 | 7/2001 |

OTHER PUBLICATIONS

"Battery Impedance", by E. Willihnganz et al., *Electrical Engineering*, Sep. 1959, pp. 922-925.

"Determining The End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128, 131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"JIS Japanese Industrial Standard-Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

National Semiconductor Corporation, "High Q Notch Filter", Mar. 1969, Linear Brief 5, Mar. 1969.

Burr-Brown Corporation, "Design A 60 Hz Notch Filter with the UAF42", Jan. 1994, AB-071, 1994.

National Semiconductor Corporation, "LMF90-4$^{th}$-Order Elliptic Notch Filter", Dec. 1994, RRD-B30M115, Dec. 1994.

"Alligator Clips with Wire Penetrators" *J.S. Popper, Inc.* product information, downloaded from http://www.jspopper.com/, undated.

"#12: LM78S40 Simple Switcher DC to DC Converter", *ITM e-Catalog*, downloaded from http://www.pcbcafe.com, undated.

"Simple DC—DC Converts Allows Use of Single Battery", *Electronix Express*, downloaded from http://www.elexp.com/t_dc-dc.htm, undated.

"DC—DC Converter Basics", *Power Designers*, downloaded from http://www.powederdesigners.com/InforWeb.design_center/articles/DC-DC/converter.shtm, undated.

"Notification of Transmittal of The International Search Report or the Declaration", PCT/US02/29461.

"Notification of Transmittal of The International Search Report or the Declaration"; PCT/US03/07546.

"Notification of Transmittal of The International Search Report or the Declaration", PCT/US03/06577.

"Notification of Transmittal of The International Search Report or the Declaration", PCT/US03/07837.

* cited by examiner

APPARATUS AND METHOD FOR PREDICTING THE REMAINING DISCHARGE TIME OF A BATTERY

CROSS REFERENCE TO RELATED APPLICATIONS

The present application is based on and claims the benefit of U.S. provisional patent application Ser. No. 60/437,255, filed Dec. 31, 2002; and U.S. provisional patent application Ser. No. 60/437,611, filed Jan. 2, 2003, the contents of which are hereby incorporated by reference in their entirety.

BACKGROUND OF THE INVENTION

The present invention relates to storage batteries. More specifically, the present invention relates to predicting a remaining discharge time of a battery.

Automotive vehicles powered by combustion engines typically include a rechargeable battery. When the vehicle is running, an alternator attached to the engine is used to charge the battery. Additionally, the alternator is used to power electrical components of the vehicle when the engine is running. However, the battery is the only source of power to continue to maintain the lights or other devices in operation when the vehicle ignition has been turned off. Further, the battery is used to provide cranking power to start the vehicle.

In typical prior art automotive vehicle charging systems, a voltage regulator is used to set a voltage, generated by the alternator, which is applied to the battery when the engine is running. In addition to such charging systems, some vehicles include systems that are capable of determining battery charge level, battery voltage, etc., and providing such information to the vehicle user. However, these prior art systems do not provide any information regarding the remaining run time of the battery, which can be useful in many applications. For example, there is a need in the trucking industry to monitor residual capacity of the battery while the truck is parked and appliances powered by the battery are used while the driver is resting. Under such conditions the battery can completely discharge, leaving the truck without power and incapable of starting.

SUMMARY OF THE INVENTION

A method and apparatus for predicting the remaining discharge time of a battery are provided. The method includes measuring a dynamic parameter of the battery, obtaining a discharge current of the battery, measuring a voltage of the battery and obtaining a temperature of the battery. The remaining run time of the battery is predicted as a function of the measured battery dynamic parameter, the discharge current, the measured battery voltage, the battery temperature, a full charge battery dynamic parameter and an estimated capacity of the battery.

BRIEF DESCRIPTION OF THE DRAWINGS

FIGS. 3-1 to 3-9 are flowcharts of a specific embodiment of the present invention.

FIG. 4 is a simplified block diagram of a battery tester in accordance with an embodiment of the present invention.

DETAILED DESCRIPTION OF THE PREFERRED EMBODIMENTS

The present invention offers an apparatus and method for predicting a remaining discharge time of a battery under a variety of conditions. Such a method and apparatus can be part of a general energy management system for a vehicle.

Figure 1:
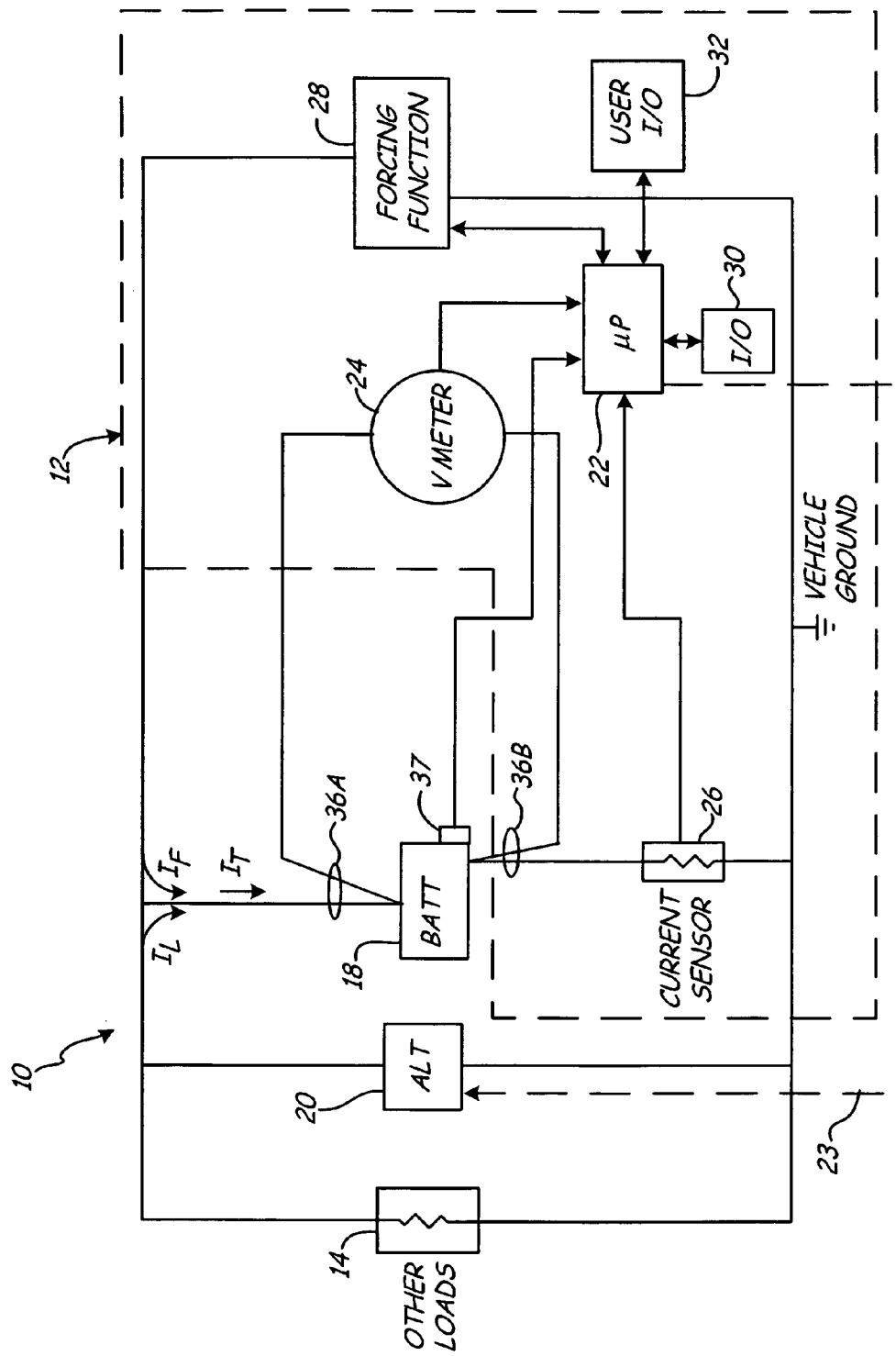
FIG. 1 is a simplified block diagram showing a system for monitoring a battery in a vehicle in accordance with an embodiment of the present invention.

FIG. 1 is a simplified block diagram showing an automotive vehicle 10 which includes a battery monitor 12, capable of predicting the remaining discharge time (or remaining run time) of a battery, in accordance with one embodiment of the present invention. Vehicle 10 includes vehicle loads 14 which are shown schematically as an electrical resistance. A battery 18 is coupled to the vehicle load 14 and to an alternator 20. Alternator 20 couples to an engine of the vehicle 10 and is used to charge battery 18 and provide power to loads 14 during operation.

In preferred embodiments, battery monitor 12 operates, with exceptions and additions as discussed below, in accordance with methods described in U.S. Pat. No. 6,331,762, issued Dec. 18, 2001, entitled ENERGY MANAGEMENT SYSTEM FOR AUTOMOTIVE VEHICLE, which is incorporated herein in its entirety. Battery monitor 12 operates in accordance with one embodiment of the present invention and measures voltage, a dynamic parameter such as conductance (G), current and temperature of battery 18. These measurements may be periodically carried out and stored in a memory, which can be within monitor 12. Using this stored data, circuitry 12 predicts a remaining run time of discharging battery 18 under a variety of conditions.

As can be seen in FIG. 1, circuitry 12 includes a processing circuitry or microprocessor 22 coupled to a voltage sensor 24, a current sensor 26, a forcing function 28 and a temperature sensor 37. Microprocessor 22 may also include one or more inputs and outputs illustrated as I/O 30 adapted to couple to an external databus or to an internal databus associated with the vehicle 10. Further, a user input/output (I/O) 32 is included for providing interaction with a vehicle operator.

The battery monitor 12 is easily installed in a vehicle electrical system. A single shunt current sensor 26 must be inserted in one of the primary battery cables and, in some embodiments, a control line is provided to allow control of alternator 20. The control can be by simply adjusting the voltage supplied to a voltage regulator of alternator 20 to thereby control charging of battery 18. The battery monitor 12 can be a separate, self-sufficient and self-contained monitor which operates without requiring interaction with other components of the vehicle except, in some embodiments, alternator 20.

In embodiments of the present invention, microprocessor 22 determines battery conductance in response to inputs, alone or in various functional combinations, from current sensor 26, voltage sensor 24, forcing function 28 and temperature sensor 37. Microprocessor 22 utilizes the measured battery conductance along with the full charge conductance adjusted to the same temperature standard as the measured battery conductance, the estimated capacity of the battery, etc., to determine the remaining run time of the battery. The determination of the remaining run time of the battery is described in detail further below.

FIG. 1 also illustrates a Kelvin connection formed by connections 36A and 36B to battery 18. With such a Kelvin connection, two couplings are provided to the positive and negative terminals of battery 18. This allows one of the electrical connections on each side of the battery to carry large amounts of current while the other pair of connections can be used to obtain accurate voltage readings. Because substantially no current is flowing through the voltage sensor 24, there will be little voltage drop through the electrical connection between sensor 24 and battery 18 thereby providing more accurate voltage measurements. In various embodiments, the forcing function 28 can be located physically proximate battery 18 or be connected directly to battery 18. In other embodiments, the forcing function 28 is located anywhere within the electrical system of vehicle 10.

In operation, microprocessor 22 is capable of measuring a dynamic parameter of battery 18. As used herein, a dynamic parameter includes any parameter of battery 18 which is measured as a function of a signal having an AC or transient component. Examples of dynamic parameters include dynamic resistance, conductance, admittance, impedance or their combinations. In various aspects of the invention, this measurement can be correlated, either alone or in combination with other measurements or inputs received by microprocessor 22, to the condition or status of battery 18. This correlation can be through testing of various batteries and may be through the use of a lookup table or a functional relationship such as a characterization curve. The relationship can also be adjusted based upon battery construction, type, size or other parameters of battery 18. Examples of various testing techniques are described in the following references which are incorporated herein by reference U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO-OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELL AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONI- CALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM, U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Pat. No. 6,621,272, issued Sep. 16, 2003, entitled PROGRAMMABLE CURRENT EXCITER FOR MEASURING AC IMMITTANCE OF CELLS AND BATTERIES, U.S. Pat. No. 6,623,314, issued Sep. 23, 2003, entitled KELVIN CLAMP FOR ELECTRICALLY COUPLING TO A BATTERY CONTACT, U.S. Pat. No. 6,633,165, issued Oct. 14, 2003, entitled IN-VEHICLE BATTERY MONITOR, U.S. Pat. No. 6,635,974, issued Oct. 21, 2003, entitled SELF-LEARNING POWER MANAGEMENT SYSTEM AND METHOD, U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/908,278, filed Jul. 18, 2001, entitled BATTERY CLAMP WITH EMBEDDED ENVIRONMENT SENSOR; U.S. Ser. No. 09/880,473, filed Jun. 13, 2001; entitled BATTERY TEST MODULE; U.S. Ser. No. 09/940,684, filed Aug. 27, 2001, entitled METHOD AND APPARATUS FOR EVALUATING STORED CHARGE IN AN ELECTROCHEMICAL CELL OR BATTERY; U.S. Ser. No. 60/330,441, filed Oct. 17, 2001, entitled ELECTRONIC BATTERY TESTER WITH RELATIVE TEST OUTPUT; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 09/992,350, filed Nov. 26, 2001, entitled ELECTRONIC BATTERY TESTER, U.S. Ser. No. 60/341,902, filed Dec. 19, 2001, entitled BATTERY TESTER MODULE; U.S. Ser. No. 10/042,451, filed Jan. 8, 2002, entitled BATTERY CHARGE CONTROL DEVICE, U.S. Ser. No. 10/073,378, filed Feb. 8, 2002, entitled METHOD AND APPARATUS USING A CIRCUIT MODEL TO EVALUATE CELL/BATTERY PARAMETERS; U.S. Ser. No. 10/093,853, filed Mar. 7, 2002, entitled ELECTRONIC BATTERY TESTER WITH NETWORK COMMUNICATION; U.S. Ser. No. 60/364,656, filed Mar. 14, 2002, entitled ELECTRONIC BATTERY TESTER WITH LOW TEMPERATURE RATING DETERMINATION; U.S. Ser. No. 10/098,741, filed Mar. 14, 2002, entitled METHOD AND APPARATUS FOR AUDITING A BATTERY TEST; U.S. Ser. No. 10/112,114, filed Mar. 28, 2002; U.S. Ser. No. 10/109,734, filed Mar. 28, 2002; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 60/379,281, filed May 8, 2002, entitled METHOD FOR DETERMINING BATTERY STATE OF CHARGE; U.S. Ser. No. 60/387,046, filed Jun. 7, 2002, entitled METHOD AND APPARATUS FOR INCREASING THE LIFE OF A STORAGE BATTERY; U.S. Ser. No. 10/177,635, filed Jun. 21, 2002, entitled BATTERY CHARGER WITH BOOSTER PACK; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 60/408,542, filed Sep. 5, 2002, entitled BATTERY TEST OUTPUTS ADJUSTED BASED UPON TEMPERATURE; U.S. Ser. No. 10/246,439, filed Sep. 18, 2002, entitled BATTERY TESTER UPGRADE USING SOFTWARE KEY; U.S. Ser. No. 60/415,399, filed Oct. 2, 2002, entitled QUERY BASED ELECTRONIC BATTERY TESTER; and U.S. Ser. No. 10/263,473, filed Oct. 2, 2002, entitled ELECTRONIC BATTERY TESTER WITH RELA- TIVE TEST OUTPUT; U.S. Ser. No. 60/415,796, filed Oct. 3, 2002, entitled QUERY BASED ELECTRONIC BATTERY TESTER; U.S. Ser. No. 10/271,342, filed Oct. 15, 2002, entitled IN-VEHICLE BATTERY MONITOR; U.S. Ser. No. 10/310,515, filed Dec. 5, 2002, entitled BATTERY TEST MODULE; U.S. Ser. No. 10/310,490, filed Dec. 5, 2002, entitled ELECTRONIC BATTERY TESTER; U.S. Ser. No. 10/310,385, filed Dec. 5, 2002, entitled BATTERY TEST MODULE, U.S. Ser. No. 60/437,255, filed Dec. 31, 2002, entitled REMAINING TIME PREDICTIONS, U.S. Ser. No. 60/437,224, filed Dec. 31, 2002, entitled DISCHARGE VOLTAGE PREDICTIONS, U.S. Ser. No. 10/349,053, filed Jan. 22, 2003, entitled APPARATUS AND METHOD FOR PROTECTING A BATTERY FROM OVERDISCHARGE, U.S. Ser. No. 10/388,855, filed Mar. 14, 2003, entitled ELECTRONIC BATTERY TESTER WITH BATTERY FAILURE TEMPERATURE DETERMINATION, U.S. Ser. No. 10/396,550, filed Mar. 25, 2003, entitled ELECTRONIC BATTERY TESTER, U.S. Ser. No. 60/467,872, filed May 5, 2003, entitled METHOD FOR DETERMINING BATTERY STATE OF CHARGE, U.S. Ser. No. 60/477,082, filed Jun. 9, 2003, entitled ALTERNATOR TESTER, U.S. Ser. No. 10/460,749, filed Jun. 12, 2003, entitled MODULAR BATTERY TESTER FOR SCAN TOOL, U.S. Ser. No. 10/462,323, filed Jun. 16, 2003, entitled ELECTRONIC BATTERY TESTER HAVING A USER INTERFACE TO CONFIGURE A PRINTER, U.S. Ser. No. 10/601,608, filed Jun. 23, 2003, entitled CABLE FOR ELECTRONIC BATTERY TESTER, U.S. Ser. No. 10/601,432, filed Jun. 23, 2003, entitled BATTERY TESTER CABLE WITH MEMORY; U.S. Ser. No. 60/490,153, filed Jul. 25, 2003, entitled SHUNT CONNECTION TO A PCB FOR AN ENERGY MANAGEMENT SYSTEM EMPLOYED IN AN AUTOMOTIVE VEHICLE, U.S. Ser. No. 10/653,342, filed Sep. 2, 2003, entitled ELECTRONIC BATTERY TESTER CONFIGURED TO PREDICT A LOAD TEST RESULT, U.S. Ser. No. 10/654,098, filed Sep. 3, 2003, entitled BATTERY TEST OUTPUTS ADJUSTED BASED UPON BATTERY TEMPERATURE AND THE STATE OF DISCHARGE OF THE BATTERY, U.S. Ser. No. 10/656,526, filed Sep. 5, 2003, entitled METHOD AND APPARATUS FOR MEASURING A PARAMETER OF A VEHICLE ELECTRICAL SYSTEM, U.S. Ser. No. 10/656,538, filed Sep. 5, 2003, entitled ALTERNATOR TESTER WITH ENCODED OUTPUT,. U.S. Ser. No. 10/675,933, filed Sep. 30, 2003, entitled QUERY BASED ELECTRONIC BATTERY TESTER, U.S. Ser. No. 10/678,629, filed Oct. 3, 2003, entitled ELECTRONIC BATTERY TESTER/CHARGER WITH INTEGRATED BATTERY CELL TEMPERATURE MEASUREMENT DEVICE, U.S. Ser. No. 10/681,666, filed Oct. 8, 2003, entitled ELECTRONIC BATTERY TESTER WITH PROBE LIGHT.

In the specific embodiment illustrated in FIG. 1, the forcing function is a function which applies a signal having an AC or transient component to battery 18. The forcing function can be through the application of a load which provides a desired forcing function in which current is drawn from battery 18, or can be through active circuitry in which a current is injected into battery 18. This results in a current labeled $I_F$ in FIG. 1. The total current, $I_T$ through battery 18 is due to both the forcing function current $I_F$ and the current flowing through loads 14, $I_L$. Current sensor 26 is positioned to sense the total current $I_T$. One example battery dynamic parameter, the dynamic conductance (or reciprocally the battery resistance) can be calculated as:

$$G = \Delta I_T / \Delta V \qquad \text{Equation 1}$$

where $\Delta V$ is the change in voltage measured across the battery 18 by voltage sensor 24 and $\Delta I_T$ is the change in total current measured flowing through battery 18 using current sensor 26. The forcing function 28 is provided in order to ensure that the current through battery 18 changes with time. However, in one embodiment, changes in $I_L$ due to loads 14 or the output from alternator 20 can be used alone such that $\Delta I_T = \Delta I_L$ and the forcing function 28 is not required.

As mentioned above, temperature sensor 37 is provided which can be coupled directly to one of the terminals, or exterior surface, of the battery 18 for measuring battery temperature. The temperature sensor 37 can be used in determining the condition of the battery, as battery condition is a function of temperature and can be used in estimating the amount of power which will be required to start the engine of the vehicle. Any type of temperature sensor can be used, for example, a thermistor, thermocouple, RTD, semiconductor or other temperature sensor.

In one embodiment, current sensor 26 comprises a resistance shunt of 250 micro ohms and current through the shunt is determined by measuring the voltage drop across the shunt. However, other types of current measurement techniques can also be used such as Hall Effect sensors or through an inductance probe.

As mentioned above, microprocessor 22 utilizes the measured battery conductance along with the full charge conductance adjusted to the same temperature standard as the measured battery conductance, the estimated capacity of the battery, etc., to determine the remaining run time of the battery. One example equation, which can be implemented in microprocessor 22, to determine the remaining run time of the battery is as follows:

$$TR = k^*(Ah/I^n)^*(V-10.5)^2 {}^*G/G0 \qquad \text{Equation 2A}$$

Where G is the measured battery conductance (using Equation 1, for example)
  G0 is the conductance at full charge and at measured or present battery temperature
  Ah is estimated ampere hours at the present time
  I is the discharge current
  n is Peukert's constant, which typically has a value between 1 and 1.5
  V is the battery voltage
  k is a proportionality constant
  TR is the time remaining until the 12V battery is depleted.

It should be noted that when an initial measurement of TR is carried out, Ah and G0 (of Equation 2A) are unknown. When these capacity and conductance values are unknown, rated capacity and conductance ($Ah_{Rated}$ and $G_{Rated}$) can be used to calculate TR as shown below:

$$TR = k^*(Ah_{Rated}/I^n)^*(V-10.5)^2 {}^*G/G_{Rated} \qquad \text{Equation 2B}$$

It should also be noted that the 10.5 volt value included in Equations 2A and 2B is a minimum terminal voltage value for a typical automobile battery. However, other minimum terminal voltage values may be used without departing from the spirit and scope of the invention.

Figure 2:
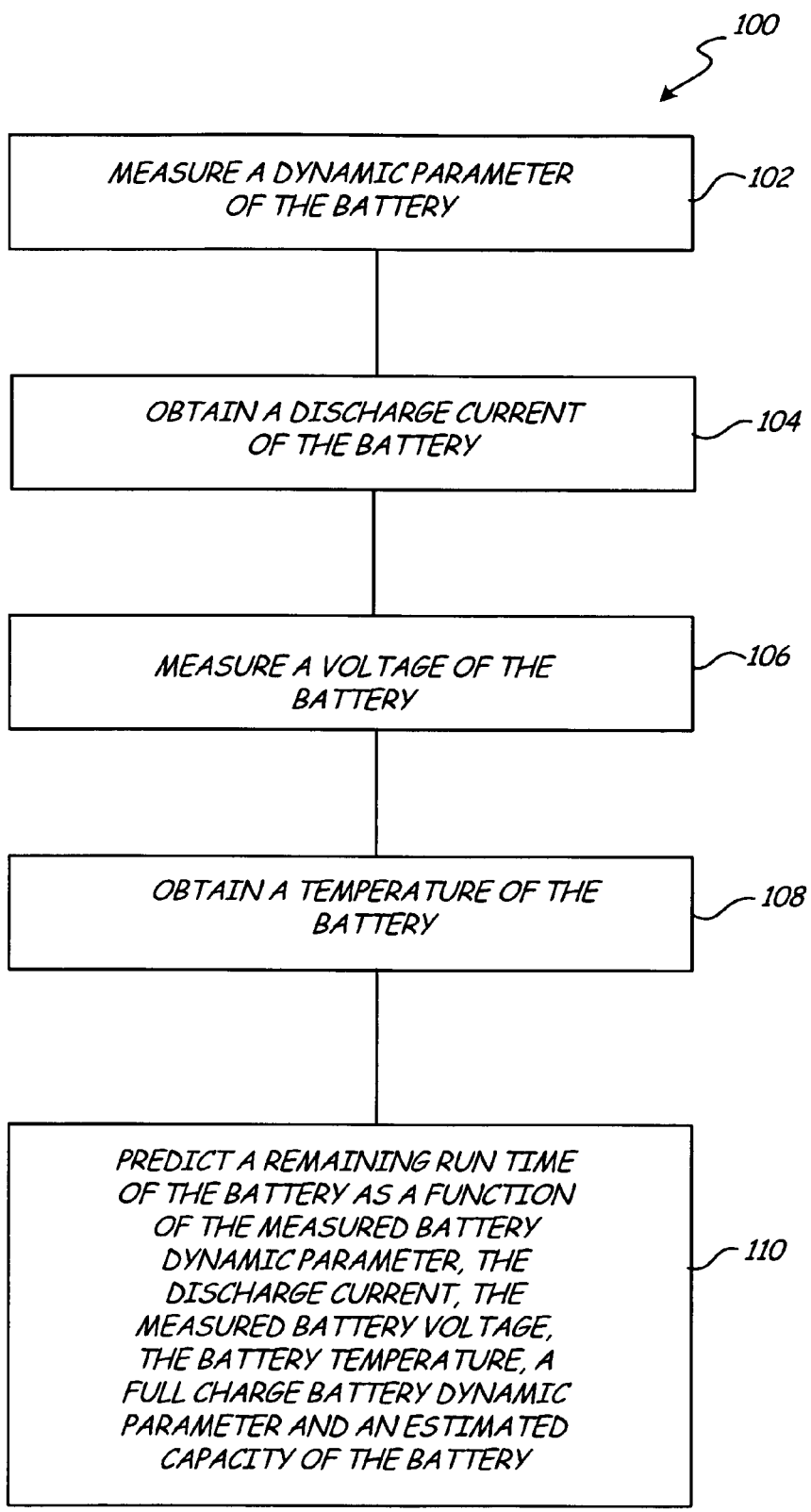
FIG. 2 is a simplified block diagram showing the steps of a method of predicting the remaining run time of a discharging battery in accordance with the present invention.

FIG. 2 is a flowchart 100 showing steps of a method of determining a remaining run time of a discharging battery in accordance with an embodiment of the present invention. At step 102, a dynamic parameter of the battery is measured. At step 104, a discharge current of the battery is obtained. At step 106, a voltage of the battery is measured. At step 108, a temperature of the battery is obtained. At step 110, the remaining run time of the battery is predicted as a function of the measured battery dynamic parameter, the discharge current, the measured battery voltage, the battery temperature, the full charge battery dynamic parameter adjusted to the same temperature standard as the measured battery dynamic parameter, and an estimated capacity of the battery.

FIGS. 3-1 to 3-9 are flowcharts illustrating the implementation of a specific embodiment of the present invention. This embodiment demonstrates how the remaining run time of the battery is predicted under a variety of conditions. This embodiment also demonstrates how battery capacity can be learned as the iterative battery monitoring/testing process is carried out.

Figures 1, 3:
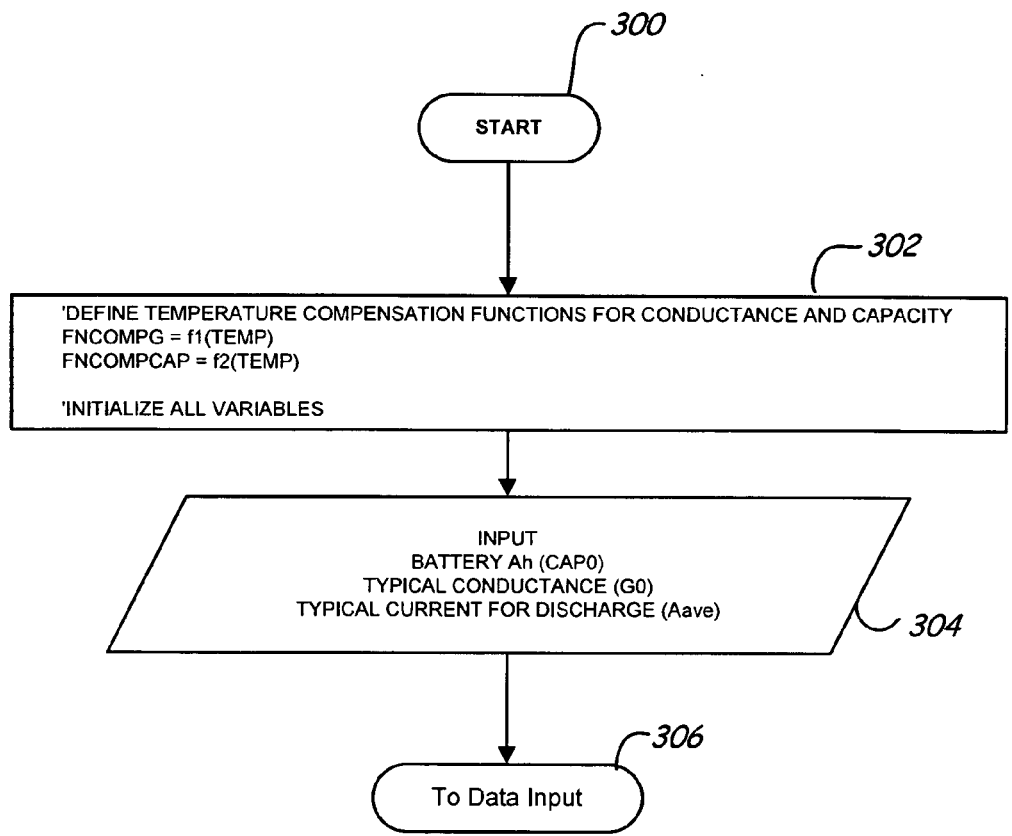
Figures 2, 3:
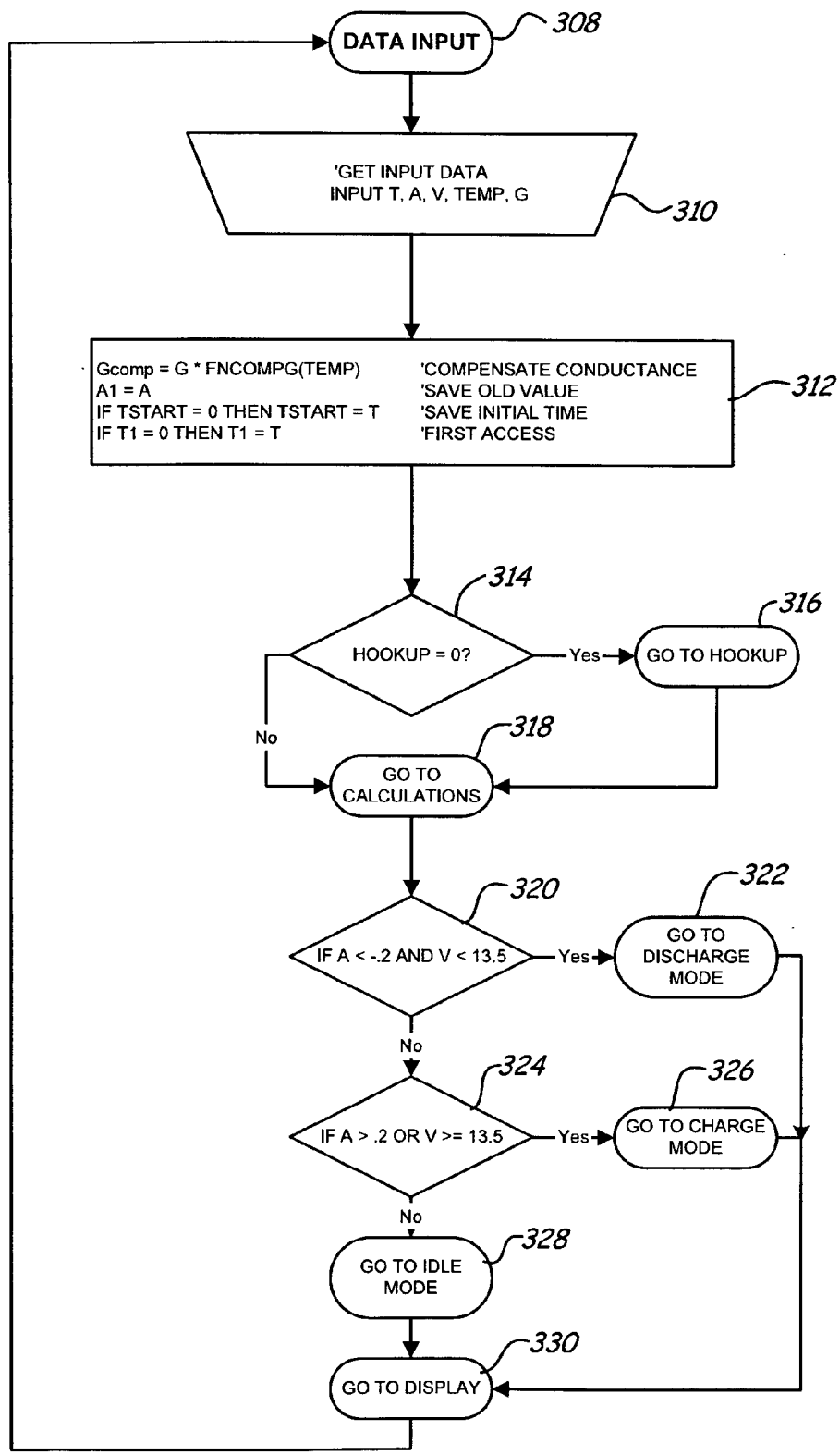
Figure 3:
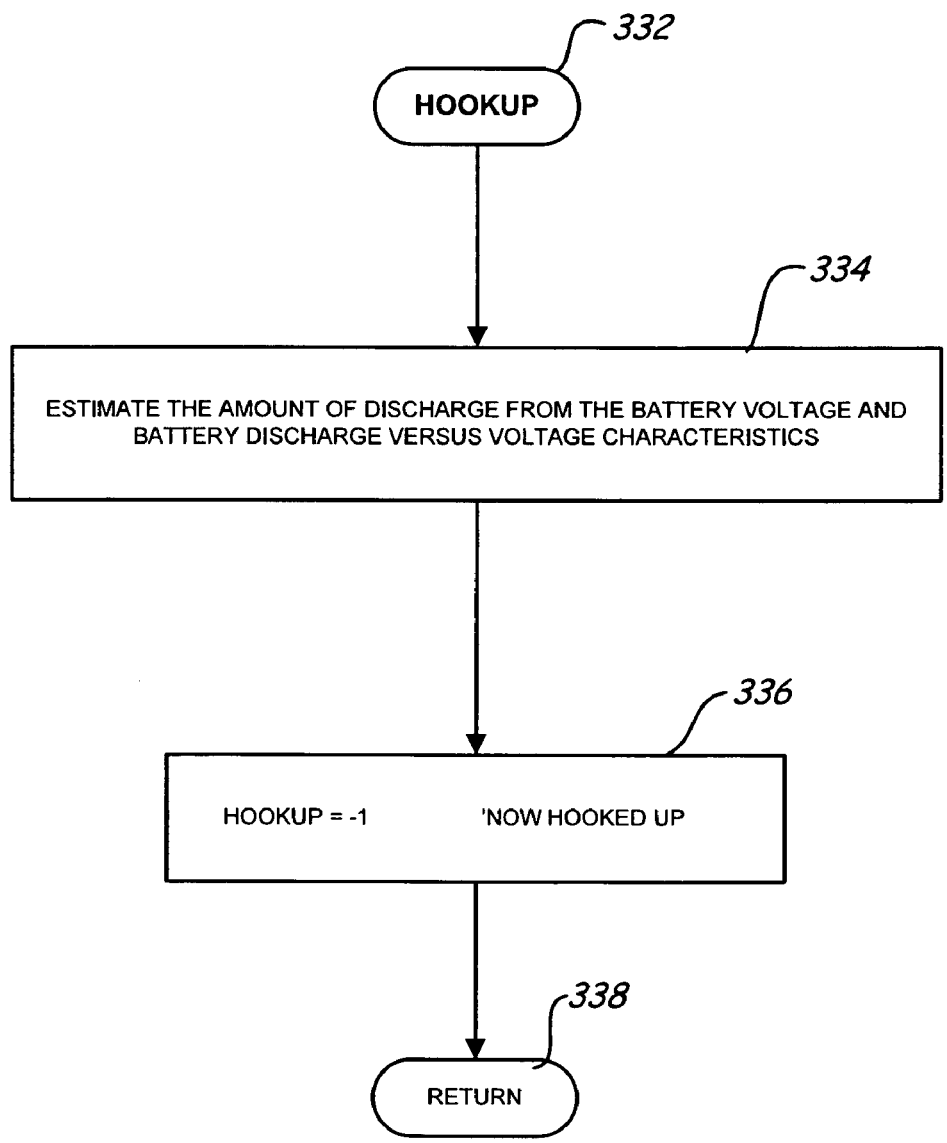

The flowchart of FIG. 3-1 shows a battery monitor startup or initialization procedure, which begins at step 300. At step 302, different functions are defined and different program variables, which are utilized for intermediate storage of data during program execution, are initialized. For example, a function used to obtain a temperature-based compensation factor for conductance, FNCOMPG=f1(TEMP), and a function used to obtain a temperature-based compensation factor for battery capacity, FNCOMPCAP=f2(TEMP), are defined at step 302. At step 304, the battery ampere hour (Ah) capacity (CAP0), typical battery conductance (G0) and typical battery current for discharge (Aave) are input. Control then passes, via step 306, to data input step 308 of a main iterative procedure shown in FIG. 3-2.

As can be seen in FIG. 3-2, at step 310, input data such as present time (T), battery current (A), battery voltage (V), battery temperature (TEMP) and battery conductance (G) are obtained. It should be noted that quantities A, V, TEMP and G are measured periodically (every 12.8 seconds, for example). At step 312, compensated battery conductance (Gcomp) is computed (Gcomp=G * FNCOMPG (TEMP)). Further, the input value of current A is saved in field A1 (A1=A). Also, fields that store initial start time (TSTART) and first access time (T1) are updated if necessary (IF TSTART=0 THEN TSTART=T; IF T1=0 THEN T1=T). At step 314, a determination is made as to whether the battery monitor is hooked up (i.e., whether an initial amount of battery discharge is ascertained) by examining the contents of a hookup indicator field or flag (HOOKUP). For example, if the hook flag is not set (HOOKUP=0), then control passes, via step 316, to the hookup procedure, which is described further below in connection with FIG. 3-3. If the hookup flag is set, then control passes, via step 318, to the calculation procedure, which is described further below in connection with FIG. 3-4. As can be seen in FIG. 3-2, control also passes to the calculation procedure when the hookup procedure is completed. After completion of the calculations procedure, at step 320, a determination is made as to whether A is less than a negative value of constant K1 (K1=0.2 amperes, for example) and whether V is less than constant K2 (K2=13.5 volts, for example). If A is less than the negative value of K1 and V is less than K2, control passes, via step 322, to a discharge mode procedure, which is described further below in connection with FIG. 3-6. If the condition in step 320 is not satisfied, control passes to step 324. At step 324, a determination is made as to whether A is greater than K1 or whether V is greater than or equal to K2. If A is greater than K1 or V is greater than or equal to K2, control passes, via step 326, to a charge mode procedure, which is described further below in connection with FIG. 3-8. If the condition in step 324 is not satisfied, control passes, via step 328, to an idle mode procedure, which is described further below in connection with FIG. 3-5. After completion of the charge mode procedure, discharge mode procedure or idle mode procedure control passes to a display procedure, which is described further below in connection with FIG. 3-9, via step 330. After completion of the display procedure, control passes back to data input 308.

FIG. 3-3 shows a flowchart of the hookup procedure, which begins at step 332. At step 334, an estimation of the amount of discharge from the battery voltage and the discharge versus voltage characteristics is carried out. At step 336, the hookup indicator field (HOOKUP) is set to a predetermined value (for example, HOOKUP=−1) to indicate that the battery monitor is hooked up. Control then returns, via step 338, to the main iterative procedure illustrated in FIG. 3-2.

Figures 3, 4:
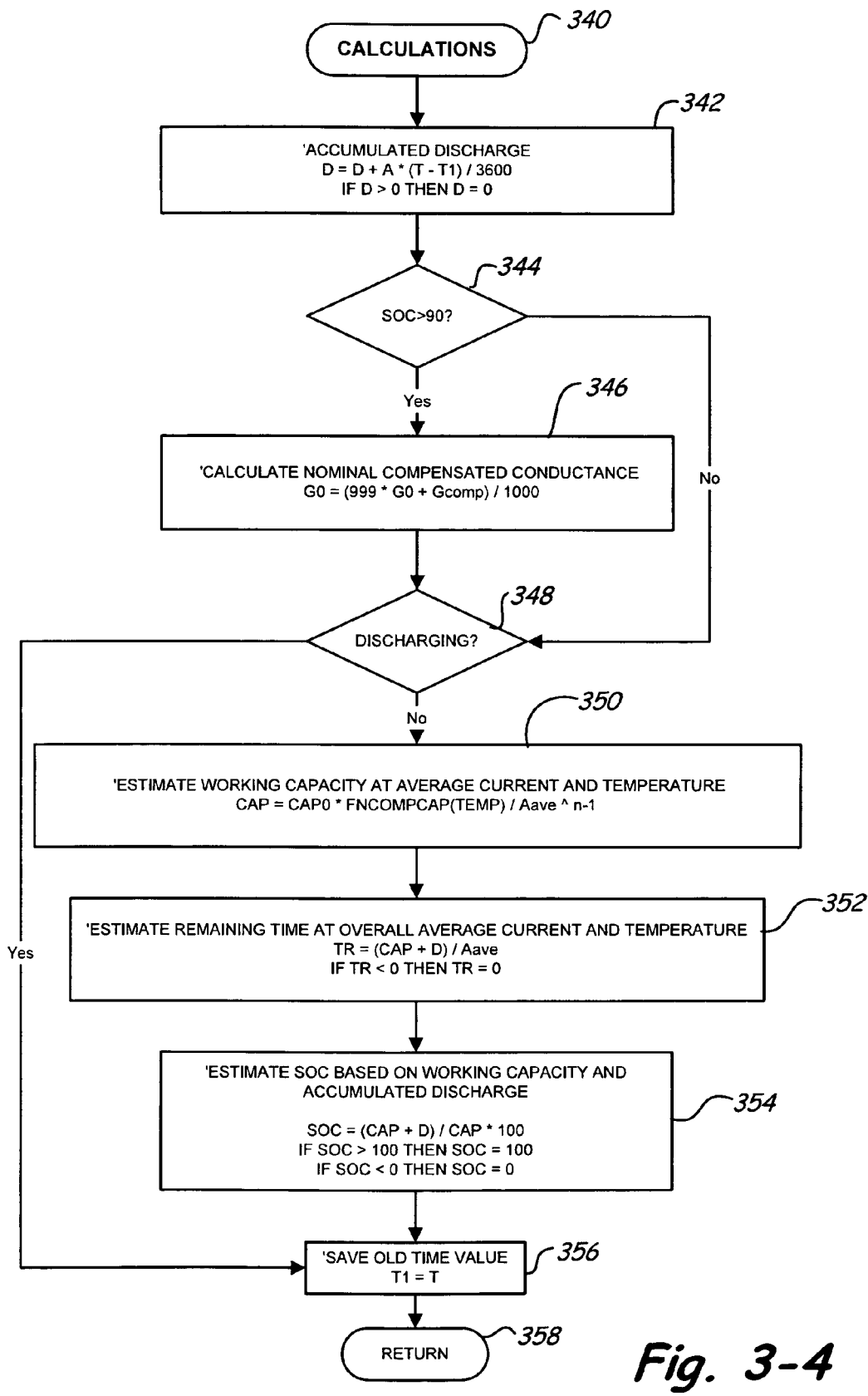

FIG. 3-4 shows a flowchart of the calculation procedure, which begins at step 340. At step 342, an accumulated discharge (D) in Ah is computed using the following relationship:

$$D=D+A*(T-T1)/3600 \qquad \text{Equation 3}$$

It should be noted that discharge D should be negative and therefore if D is greater than zero, then D is set equal to zero (IF D>0 THEN D=0). At step 344, a determination is made as to whether a state of charge (SOC) of the battery, which is expressed as a percentage, is greater than a constant K3 (K3=90%, for example). If SOC is greater than K3, nominal compensated conductance is calculated, at step 346, using a weighted averaging relationship:

$$G0=(K4*G0+G\text{comp})/(K4+1) \qquad \text{Equation 4}$$

where K4 is a constant that is equal to 999 when measurements (battery voltage, current etc.) are carried out every 12.8 seconds, for example. It should be noted that, in general, the value of K4 is dependent upon the frequency at which measurements are carried out. If SOC is less than or equal to K3, control passes to step 348. Also, after nominal compensated conductance is determined at step 346, control passes to step 348. At step 348, a determination is made as to whether the battery is discharging. If the battery is not discharging, at step 350, an estimation of the working capacity (CAP) of the battery at average current and present temperature is carried out using the following relationship:

$$CAP=CAP0*FNCOMPCAP(TEMP)/(A\text{ave})^{n-1} \qquad \text{Equation 5}$$

where n is Peukert's constant for a particular battery and typically has a value between 1 and 1.5 depending on the type of battery. At step 352, a remaining run time (TR) of the battery at overall average current and temperature is determined using the following relationship:

$$TR=(CAP+D)/A\text{ave} \qquad \text{Equation 6}$$

TR cannot be negative and therefore if TR is less than zero, then TR is set equal to zero. At step 354, SOC is estimated based on working capacity and accumulated discharge using the following relationship:

$$SOC=(CAP+D)/CAP*100 \qquad \text{Equation 7}$$

Since SOC is expressed as a percentage, it has to be between zero and one hundred. Therefore, if SOC is greater than 100, then SOC is set equal to 100. Similarly, if SOC is less than 0, then SOC is set equal to 0. After the computation of SOC at step 354, control passes to step 356. Also, if, at step 348, a determination is made that the battery is discharging, then control passes to step 356. At step 356, an old time value is saved by setting T1 equal to T. Control then returns, via step 358, to the main iterative procedure illustrated in FIG. 3-2.

Figures 3, 4, 5:
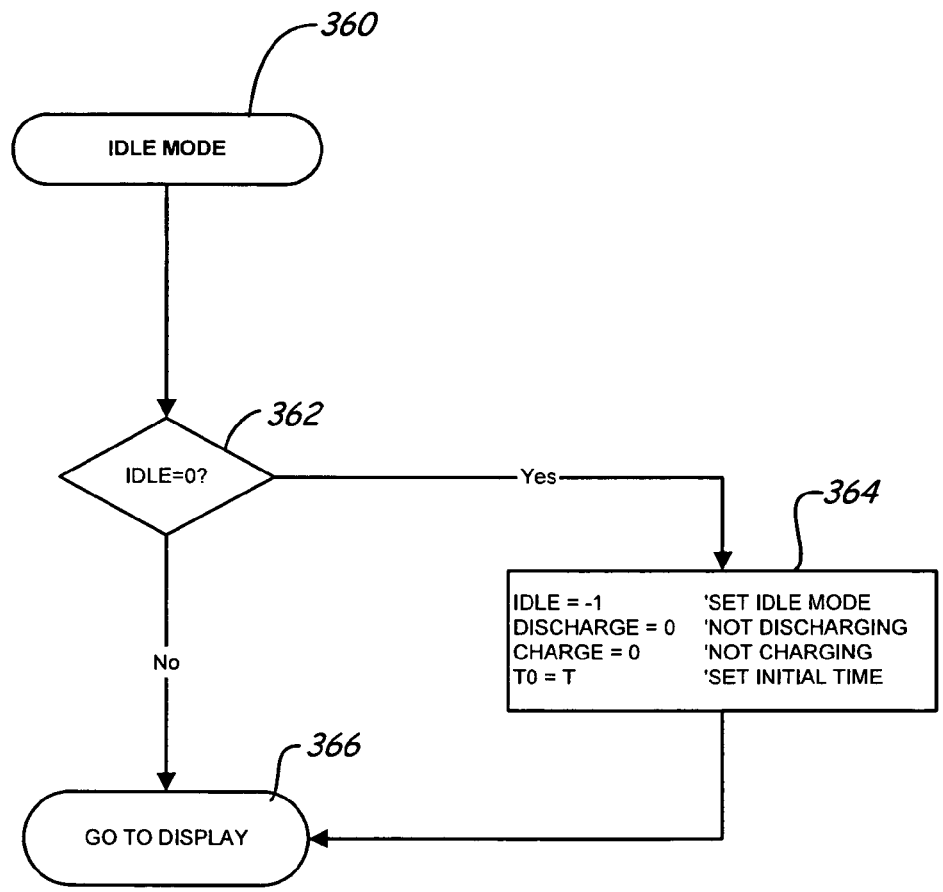
Figures 3, 4, 5, 6:
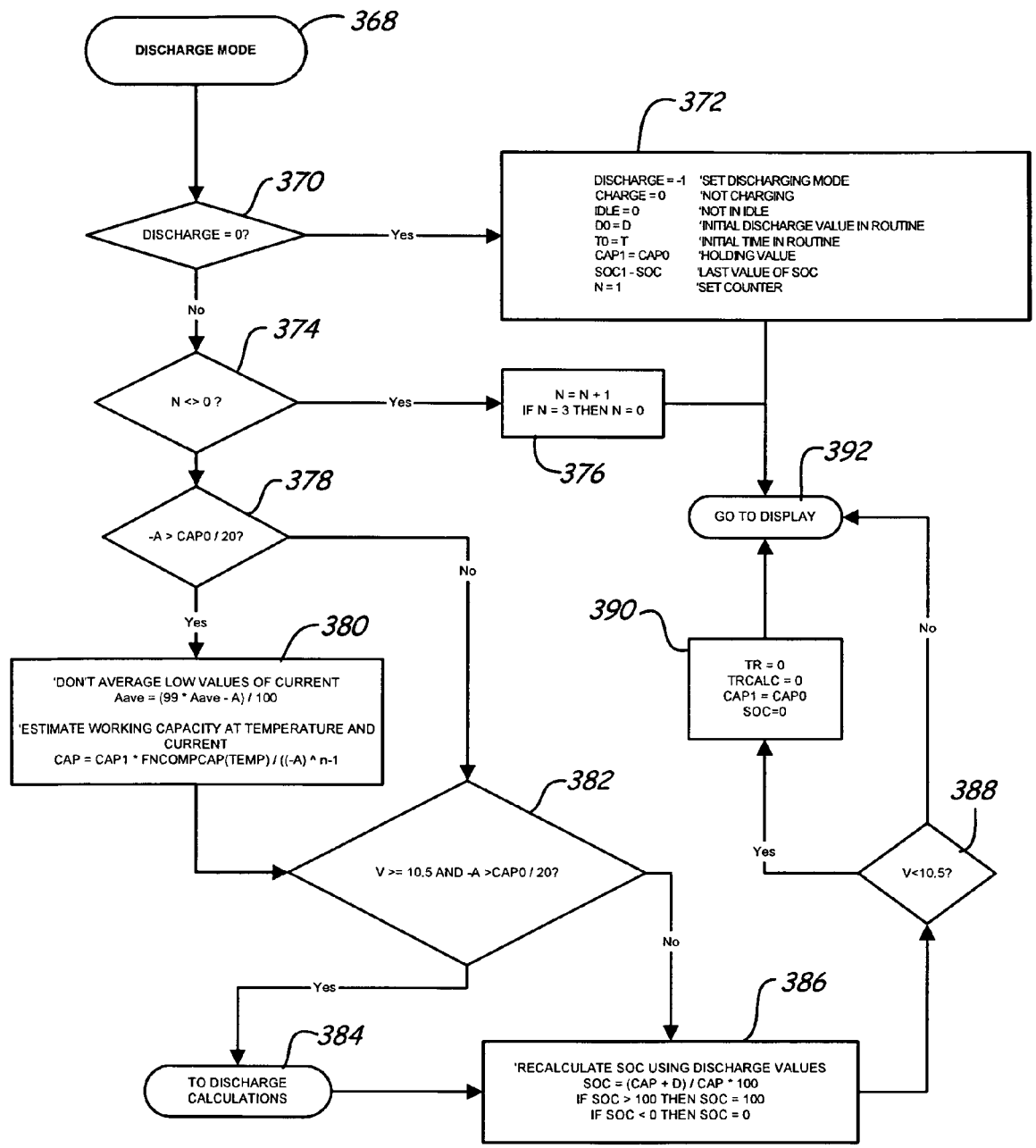
Figures 3, 4, 5, 6, 7:
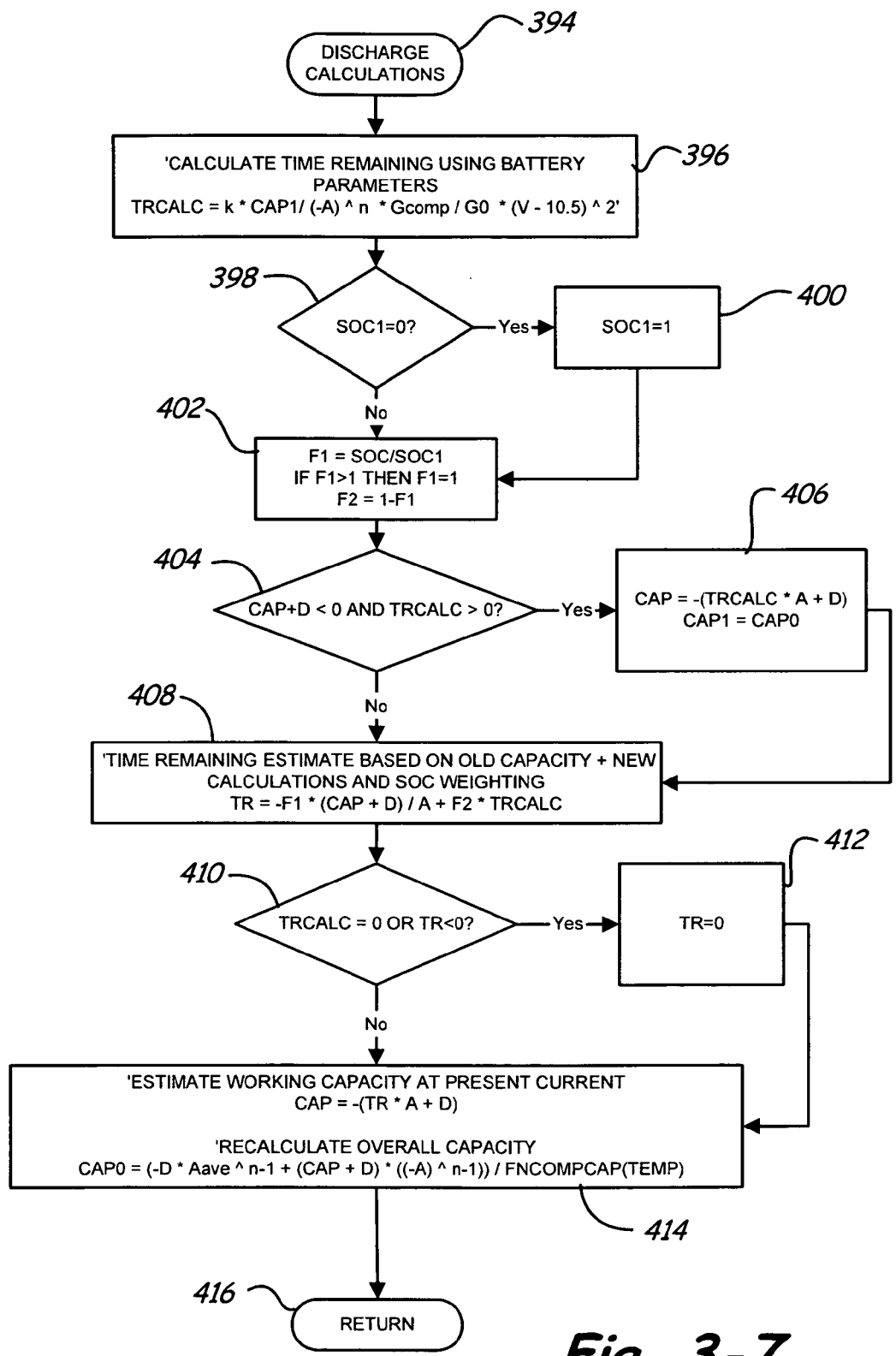
Figures 3, 4, 5, 6, 7, 8:
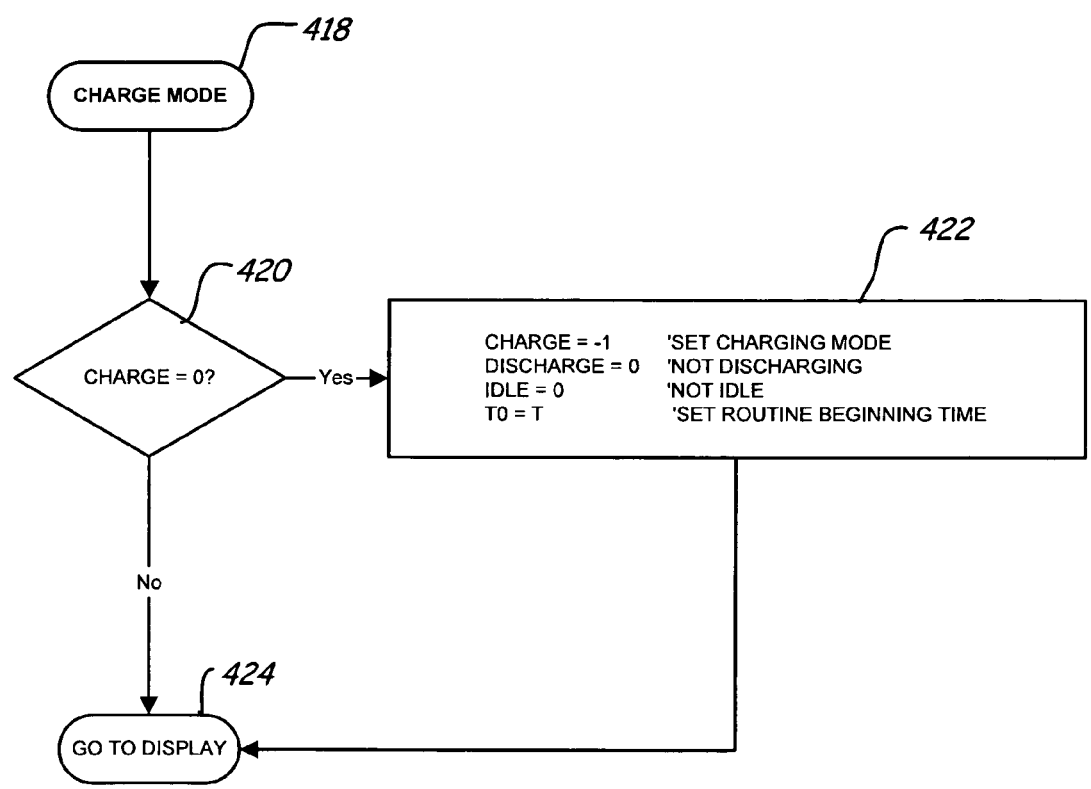
Figures 3, 4, 5, 6, 7, 8, 9:
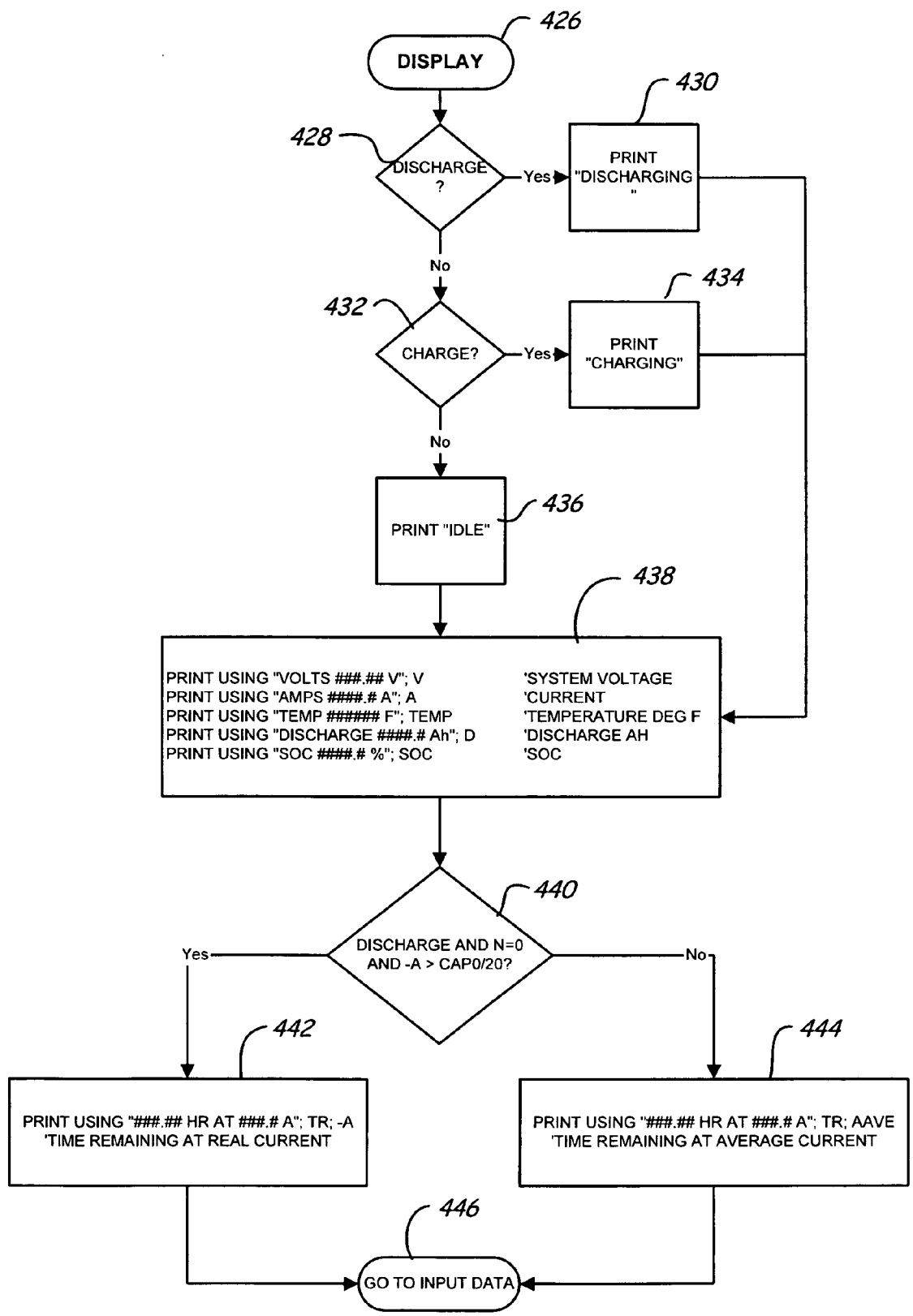
Figure 4:
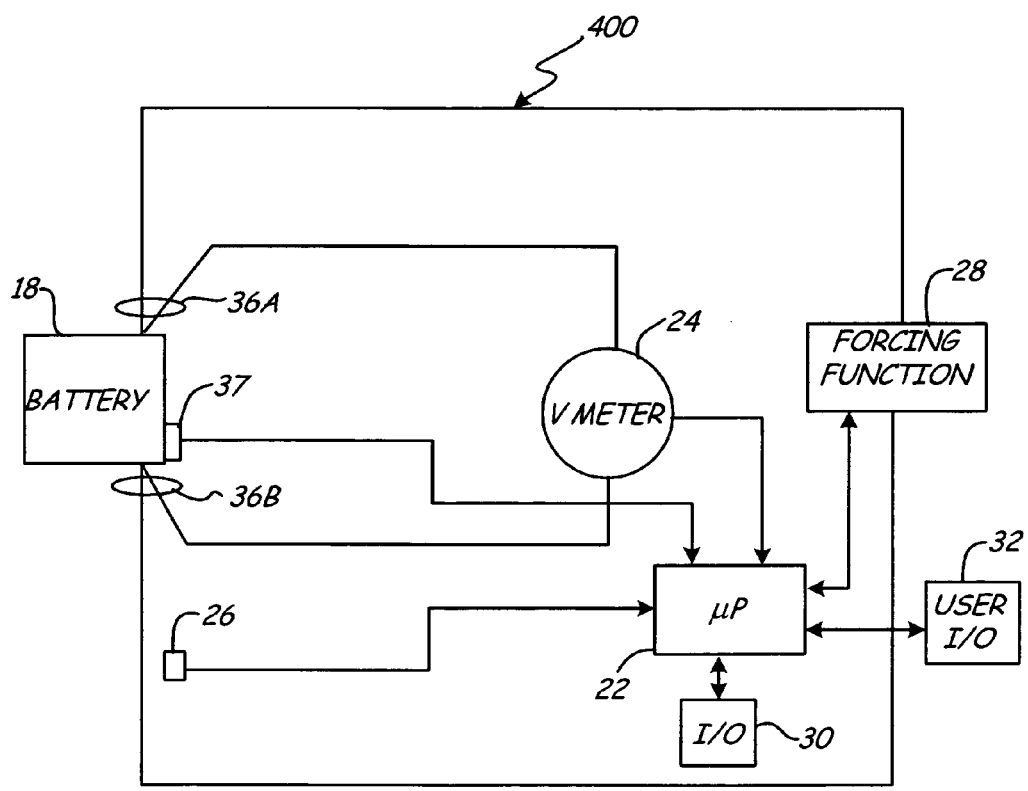

FIG. 3-5 shows a flowchart of an idle mode procedure, which begins at step 360. At step 362, a determination is made as to whether an idle mode is set by examining the contents of an idle mode indicator field (IDLE). For example, if IDLE=0 (i.e., the idle mode is not set), then control passes to step 364, where the idle mode is set (for example, IDLE=−1). Also, the charge and discharge indicator fields are appropriately set to indicate that the battery is not charging or discharging. Further, the initial time T0 is set equal to T at step 364. After completion of step 364, control passes to step 366. Also, if IDLE is not equal to 0 at step 362, then control passes to step 366. At step 366, control is passed to the display procedure, which is described further below in connection with FIG. 3-9.

FIG. 3-6 shows a flowchart of a discharge mode procedure, which begins at step 368. At step 370, a determination is made as to whether a discharge mode is set by examining the contents of a discharge mode indicator field (DISCHARGE). For example, if DISCHARGE=0 (i.e., the discharge mode is not set), then control passes to step 372 where the discharge mode is set (for example, DISCHARGE=−1). Also, the charge and idle indicator fields are appropriately set to indicate that the battery is not charging or idle. Further, at step 372, the initial discharge value D0 is set equal to D; the initial time T0 is set equal to T; field CAP1 is set equal to CAP0; field SOC1 is set equal to SOC to hold the last value of SOC, and counter (N) is set equal to 1. If DISCHARGE is not equal to 0, then control passes to step 374 where a determination is made as to whether the counter N is not equal to 0. If the condition in step 374 is satisfied, then, at step 376, N is incremented by one (N=N+1). Further, at step 376, if N is equal to 3, for example, then N is set equal to 0. This step is carried out to eliminate transition values and instantaneous spikes in the discharge, again dependent upon the frequency of data collection. If the condition in step 374 is not satisfied, then control passes to step 378 at which a determination is made as to whether a negative or absolute value of the discharge current (−A) is greater than CAP0 divided by 20. If the condition at step 378 is satisfied, then low values of current are not averaged at step 380. The following weighted averaging relationship is used to determine average discharge current:

$$Aave = (K5*Aave - A)/(K5+1) \quad \text{Equation 8}$$

where K5 is a constant that is equal to 99 when measurements are carried out every 12.8 seconds, for example. It should be noted that, in general, the value of K5 is dependent upon the frequency at which measurements are carried out. Further, at step 380, an estimation of the working capacity at measured temperature and current is carried out using the following relationship:

$$CAP = CAP1*FNCOMPCAP(TEMP)/(-A)^{n-1} \quad \text{Equation 9}$$

If the condition at step 378 is not satisfied, or after the completion of step 380, step 382 is carried out. At step 382, a determination is made as to whether V is greater than or equal to the minimum terminal voltage value for a typical automobile battery (10.5 volts, for example) and whether a negative value of current (−A) is greater than CAP0 divided by 20 (whether a significant amount of current is being discharged). If the condition at step 382 is satisfied, control passes to step 384 which, in turn, directs control to a discharge calculation procedure, which is described further below in connection with FIG. 3-7. If the condition at step 382 is not satisfied, or after the completion of the discharge calculations, step 386 is carried out. At step 386, using the above Equation 7, SOC is recalculated using discharge values. At step 388, a determination is made as to whether V is less than 10.5 volts. If this condition is satisfied, then TR, TRCALC (time remaining calculated using battery parameters), and SOC are set equal to 0 and CAP1 is set equal to CAP0. If the condition in step 388 is not satisfied, control passes to step 392. Also, completion of any one of steps 372, 376 and 390 results in control being passed to step 392. At step 392, control is passed to the display procedure, which is described further below in connection with FIG. 3-9.

FIG. 3-7 shows a flowchart of a discharge calculation procedure, which begins at step 394. At step 396, the time remaining is calculated using battery parameters with the help of the following relationship:

$$TRCALC = K6*CAP1/(-A)^n*Gcomp/G0*(V-10.5)^2 \quad \text{Equation 10}$$

where K6 is a constant. At step 398, a determination is made as to whether SOC1 is equal to 0. If SOC1 is equal to zero, then SOC1 is set equal to 1 at step 400. If SOC is not equal to zero at step 398, or after the completion of step 400, control passes to step 402. At step 402, field F1 is set equal to SOC divided by SOC1. If F1 is greater than 1, then F1 is set equal to 1. Field F2 is set equal to 1 minus F1. At step 404, a determination is made as to whether CAP plus D is less than 0 and whether TRCALC is greater than 0. If this condition is satisfied, CAP is set equal to a negative value of a product of TRCALC and A plus D at step 406. Further CAP1 is set equal to CAP0, which gets recalculated after each iteration. If the condition at step 404 is not satisfied, or after the completion of step 406, control passes to step 408. At step 408, the time remaining is estimated based on previously estimated capacity and new calculations and SOC weighting using the following relationship:

$$TR = -F1*(CAP+D)/A + F2*TRCALC \quad \text{Equation 11}$$

At step 410, a determination is made as to whether TRCALC is equal to 0 or whether TR is less than 0. If this condition is satisfied, TR is set equal to zero at step 412. If the condition at step 410 is not satisfied, or after the completion of step 412, control passes to step 414. At step 414, working capacity is estimated at present current using the following relation:

$$CAP = -(TR*A+D) \quad \text{Equation 12}$$

Also, at step 414, overall capacity is recalculated using the following relation:

$$CAP0 = (-D*(Aave)^{n-1} + (CAP+D)*((-A)^{n-1}))/FNCOMPCAP(TEMP) \quad \text{Equation 13}$$

Control then returns, via step 416, to the discharge mode procedure illustrated in FIG. 3-6.

FIG. 3-8 shows a flowchart of a charge mode procedure, which begins at step 418. At step 420, a determination is made as to whether a charge mode is set by examining the contents of a charge mode indicator field (CHARGE). For example, if CHARGE=0 (i.e., the charge mode is not set), then control passes to step 422, where the charge mode is set (for example, CHARGE=−1). Also, the discharge and idle indicator fields are appropriately set to indicate that the battery is not discharging or idle. Further, the initial time T0 is set equal to T at step 422. After completion of step 422, control passes to step 424. Also, if CHARGE is not equal to 0 at step 420, then control passes to step 424. At step 424, control is passed to the display procedure, which is described below in connection with FIG. 3-9.

FIG. 3-9 shows a flowchart of a display procedure, which begins at step 426. At step 428, a determination is made as to whether the battery is discharging. If the battery is found to be discharging, a message "DISCHARGING" is displayed at step 430. If the battery is not found to be discharging at step 428, a determination is made as to whether the battery is charging at step 432. If the battery is found to be charging, a message "CHARGING" is displayed at step 434. If the battery is not found to be charging at step 432, a message "IDLE" is displayed at step 436. After completion of any of steps 430, 434 and 436, control passes to step 438. At step 438, system voltage, current, temperature in degrees Fahrenheit, discharge in Ah and SOC expressed as a percentage are displayed. At step 440, a determination is made as to whether discharge and N are equal to 0 and whether a negative value of current (−A) is greater than CAP0 divided by 20. This condition is a test as to whether a significant amount of current is being discharged and that the discharge is persistent. If this condition is satisfied, the time remaining at real current is displayed at step 442. If the condition of step 440 is not satisfied, the time remaining at average current is displayed at step 444. Control from steps 442 and 444 passes to step 446. Control then returns, via step 446, to the data input step 308 of the main iterative procedure illustrated in FIG. 3-2.

Instructions for carrying out the above procedure (FIGS. 3-1 to 3-9) are stored in a memory (not shown), which may be a part of microprocessor 22, which executes these instructions. Different techniques, some of which are set forth above, can be employed to carry out the steps shown in the above flowcharts while maintaining substantially the same functionality without departing from the scope and spirit of the present invention.

Although the present invention has been described with reference to preferred embodiments, workers skilled in the art will recognize that changes may be made in form and detail without departing from the spirit and scope of the invention. In addition, although embodiments of the present invention, described above, relate to an in-vehicle battery monitor capable of determining the remaining run time of a discharging battery, it should be noted that the remaining run time determination technique of the present invention can also be implemented in a hand-held device, for example, that is not installed in the vehicle. Such a device (battery tester 400 shown in FIG. 4) includes Kelvin probes (36A and 36B) for temporary electrical coupling to the vehicle battery. In general, the components of such a device are similar to that of battery monitor 12 (FIG. 1) described above. In the embodiment of FIG. 4, current sensor 26 can be a Hall-effect current sensor that senses current when positioned within a magnetic field produced by an electrical conductor (not shown) that is coupled to a terminal (not shown) of battery 18.

It should be noted that, in general, battery temperature influences different battery measurements and battery test results. Thus, in a number of the above Equations, temperature compensated battery conductance values are used to determine the remaining run time of the battery and for other intermediate calculations. Specifically, at least one of the measured battery dynamic parameter and the full charge battery dynamic parameter are adjusted such that the measured battery dynamic parameter and the full charge battery dynamic parameter are at the same temperature standard. However, workers skilled in the art will recognize that temperature compensation may be inherent when certain measurements are carried out. For example, it has been observed that, at different temperatures, battery voltage measurements tend to compensate for battery conductance measurements obtained. Therefore, in some embodiments of the present invention, non-compensated conductance (G) can be employed instead of compensated conductance (Gcomp) in Equation 10, for example. In such embodiments, G0 is the full charge battery conductance at a fixed temperature (25 degrees Celsius, for example) at which battery capacity is normally determined.

What is claimed is:

1. A method comprising:
    (a) measuring a dynamic parameter of a battery;
    (b) obtaining a discharge current of the battery;
    (c) measuring a voltage of the battery;
    (d) obtaining a temperature of the battery; and
    (e) predicting a remaining run time of the battery as a function of the measured battery dynamic parameter, the discharge current, the measured battery voltage, the battery temperature, a full charge battery dynamic parameter, a non-zero minimum terminal voltage value of the battery and an estimated capacity of the battery.

2. The method of claim 1 wherein at least one of the measured battery dynamic parameter and the full charge battery dynamic parameter are adjusted such that the measured battery dynamic parameter and the full charge battery dynamic parameter are at a same temperature standard.

3. The method of claim 1 wherein the dynamic parameter measurement step (a) comprises determining a response of the battery to an applied current pulse.

4. The method of claim 1 wherein the measured battery dynamic parameter is battery conductance.

5. The method of claim 1 wherein the measured battery dynamic parameter is battery resistance.

6. A battery monitor implementing the method of claim 1.

7. The method of claim 6 wherein the battery monitor carries out steps (a)–(e) iteratively.

8. A battery tester implementing the method of claim 1.

9. An apparatus comprising:
    a positive connector coupled to a positive terminal of a battery;
    a negative connector coupled to a negative terminal of the battery;
    a voltage sensor configured to measure a voltage of the battery;
    a temperature sensor configured to measure a temperature of the battery;
    a current sensor configured to measure a discharge current of the battery; and
    processing circuitry configured to measure a dynamic parameter of the battery using the first and second connectors, and to predict a remaining run time of the battery as a function of the measured battery dynamic parameter, the discharge current, the measured battery voltage, the battery temperature, a full charge battery dynamic parameter, a non-zero minimum terminal voltage value of the battery and an estimated capacity of the battery.

10. The apparatus of claim 9 wherein processing circuitry is further configured to adjust at least one of the measured battery dynamic parameter and the full charge battery dynamic parameter such that the measured battery dynamic parameter and the full charge battery dynamic parameter are at a same temperature standard.

11. The apparatus of claim 9 further comprising a forcing function configured to apply a current pulse to the battery, wherein the processing circuitry is configured to measure the dynamic parameter by determining a response of the battery to an applied current pulse.

12. The apparatus of claim 9 wherein the measured battery dynamic parameter is battery conductance.

13. The apparatus of claim 9 wherein the measured battery dynamic parameter is battery resistance.

14. The apparatus of claim 9 wherein the positive connector is a first Kelvin connector and the negative connector is a second Kelvin connector.

15. The apparatus of claim 9 further comprising an output configured to display the remaining run time of the battery.

* * * * *